United States Patent [19]

Suzuki

[11] 3,992,678

[45] *Nov. 16, 1976

[54] PROTECTIVE CIRCUIT FOR TRANSISTOR AMPLIFIER

[75] Inventor: Tadao Suzuki, Tokyo, Japan

[73] Assignee: Sony Corporation, Tokyo, Japan

[ * ] Notice: The portion of the term of this patent subsequent to Sept. 9, 1992, has been disclaimed.

[22] Filed: Mar. 26, 1975

[21] Appl. No.: 562,346

Related U.S. Application Data

[63] Continuation-in-part of Ser. No. 382,139, July 24, 1973, Pat. No. 3,904,979.

[30] Foreign Application Priority Data

July 27, 1972 Japan.................. 47-75414

[52] U.S. Cl.................. 330/207 P; 307/202 R; 317/33 R; 330/15; 330/17
[51] Int. Cl.².......................................... H03F 21/00
[58] Field of Search.................. 307/202; 317/33 R; 330/15, 17, 207 P

[56] References Cited
UNITED STATES PATENTS

| | | |
|---|---|---|
| 3,364,391 | 1/1968 | Jensen.............. 317/33 R |
| 3,536,958 | 10/1970 | Sondermeyer............ 317/33 R |
| 3,681,659 | 8/1972 | Suzuki.................. 330/207 P X |
| 3,904,979 | 9/1975 | Suzuki.................. 330/207 P |

*Primary Examiner*—James B. Mullins
*Assistant Examiner*—Lawrence J. Dahl
*Attorney, Agent, or Firm*—Hill, Gross, Simpson, Van Santen, Steadman, Chiara & Simpson

[57] ABSTRACT

A protective circuit for a transistor amplifier is provided which measures the load impedance and actuates a protective means across an input terminal of the transistor amplifier when a measured value of said load impedance becomes lower than a predetermined value, to protect the transistor amplifier from overload. The protective circuit is applicable for a class B push-pull amplifier and, particularly effective to protect the overload even when the load of the amplifier has a reactance component. Various modifications such as relay type protective circuits are also disclosed.

7 Claims, 14 Drawing Figures

PROTECTIVE CIRCUIT FOR TRANSISTOR AMPLIFIER

CROSS REFERENCE TO RELATED APPLICATIONS

This application is a continuation-in-part of my application Ser. No. 382,139, now U.S. Pat. No. 3,904,979, filed July 24, 1973.

BACKGROUND OF THE INVENTION

1. Field of the Invention

The present invention relates generally to a protective circuit for a transistor amplifier, and more particularly to a protective circuit for a transistor amplifier which is effective when used for protecting the amplifier against a decrease in a load impedance some predetermined critical point.

2. Description of the Prior Art

Figure 1:
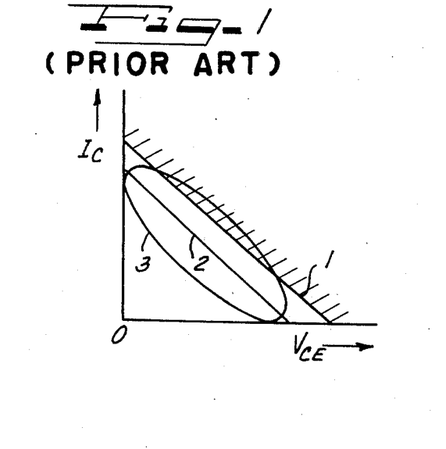
FIG. 1 is a graph for showing the control characteristic of a conventional protective circuit for a transistor amplifier.

In a conventional protective circuit for a transistor amplifier, a protective line for the characteristic between the collector-emitter voltage $V_{CE}$ and the collector current $I_C$ of a transistor to be protected can be indicated by a line 1 shown in FIG. 1. In the case where a load is a pure resistance or a load similar to a pure resistance, for the protective characteristic, a load line such as indicated by a line 2 in FIG. 1, allows normal protective operation to be carried out. However, in the case where the load includes a reactance component, such as a condenser speaker, the load line becomes an ellipse 3 as shown in FIG. 1 and thus the load line of the ellipse 3 intersects with the protective line 1 with the result that the protective operation is also carried out for other than overload conditions. In such a case, since even if the load line becomes an ellipse 3, the ellipse 3 exceeds the tolerable collector loss of a transistor only for an instant and the transistor is not damaged in practice. In other words, in the case of the impedance load, the transistor is not destroyed even if the load line 3 becomes an ellipse which crosses the protective line 1, but the protective circuit operates which means the protective circuit operates when it should not.

SUMMARY OF THE INVENTION

It is an object of this invention to provide a protective circuit for a transistor amplifier which avoids erroneous operation when an impedance load is used.

It is another object of this invention to provide a protective circuit for a transistor amplifier which performs its protective operation when a load impedance is lower than a predetermined value.

It is a further object of this invention to provide a protective circuit for a transistor amplifier which is effective when it is used for a class B push-pull amplifier.

It is a further object of this invention to provide a protective circuit for a transistor amplifier which has a first rectifier circuit for rectifying a voltage in association with a load current, a second rectifier circuit for rectifying a voltage in association with a load voltage, a capacitor supplied with the output from the first and second rectifier circuits in opposite polarities and a protective circuit controlled with the terminal voltage across the capacitor.

It a further object of this invention to provide a protective circuit for a transistor amplifier in which an input signal applied thereto is muted when the detected output from a load impedance detector circuit is lower than a predetermined value.

It is a yet further object of this invention to provide a protective circuit for a transistor amplifier in which a bias current therefor is controlled when the detected output from a load impedance detector circuit is lower than a predetermined value.

It is an object to provide relay type protective circuits as well as single ended push-pull amplifier type protective circuits.

The additional and other objects, features and advantages of this invention will become apparent from the following description taken in conjunction with the accompanying drawings.

DESCRIPTION OF THE PREFERRED EMBODIMENTS

A description will be hereinbelow given of an example in which the present invention is applied to a class B push-pull power amplifier with positive and negative electric power sources.

Figure 2:
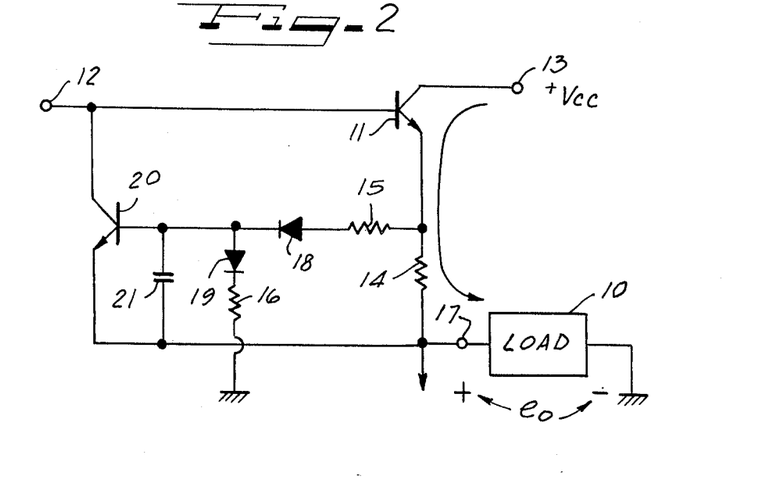
FIG. 2 is a basic circuit diagram of an example of a protective circuit for a transistor amplifier according to the present invention.

FIG. 2 illustrates the present invention as applied to one side of a class B push-pull transistor amplifier which amplifies the positive half of an input signal. In FIG. 2, reference numeral 11 is an output transistor which is to be protected which has its base electrode supplied with an input signal through a terminal 12 from a driving stage (not shown), and which is also supplied with a base bias voltage. The collector electrode of the output transistor 11 is connected to a positive power source terminal 13 of +Vcc, and its emitter electrode is connected through a resistor 14 for detecting a load current to an output terminal 17 which is grounded through a load 10. The emitter electrode of the output transistor 11 is further connected through a series connection of a resistor 15 and a diode 18 for rectifying the peak value to the base electrode of a switching transistor 20. The base electrode of the switching transistor 20 is also connected through a capacitor 21 to the output terminal 17 and is grounded through a series connection of a resistor 16 and diode 19 for rectifying the peak value. The emitter electrode of the transistor 20 is connected to the terminal 17, and the collector electrode is connected to the base electrode of the output transistor 11.

Figure 3:
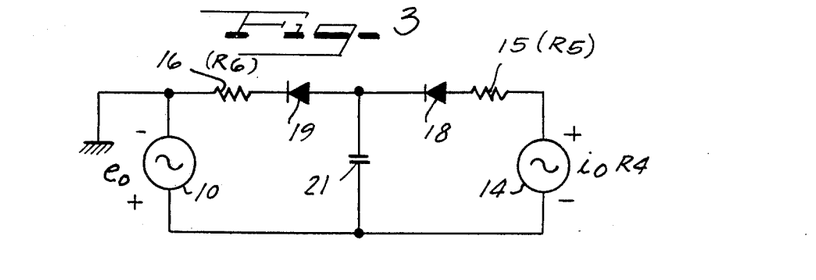
FIGS. 3 and 4 are respectively equivalent circuits used for explaining the basic circuit of the invention.

With such a circuit construction, if it is assumed that the collector current of the transistor applied or a load current flowing through the resistor 14 to the load 10 is $i_0$; a load voltage across the load 10 will be $e_0$; and the resistance values of the resistors 14, 15 and 16 as $R_4$, $R_5$, and $R_6$, respectively, the equivalent circuit of the circuit of FIG. 2 will be as shown in FIG. 3. That is to say, the resistor 14 can be considered a voltage source 14 having the voltage $i_0R_4$ and the load 10 as a voltage source 10 of voltage $e_0$. Thus, the capacitor 21 will be charged with the output from the voltage source 14 but will be discharged with the output from the voltage source 10. In other words, the voltages $i_0R_4$ and $e_0$ are rectified peak values by the diodes 18 and 19, respectively, and then values to the capacitor 21 in opposite polarities.

Figure 4:
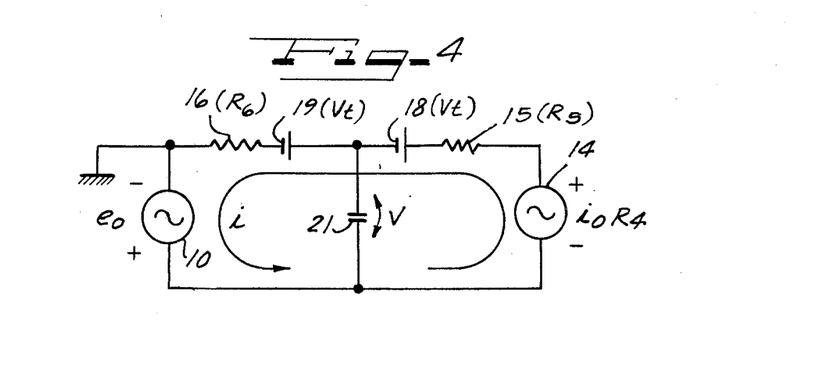

If the resistance in the forward direction of the diodes 18 and 19 is neglected and their voltage drop in the forward direction is taken as $V_f$, the equivalent circuit of FIG. 3 can be further replaced as shown in FIG. 4. In this case, if the current flowing through the equivalent circuit of FIG. 4 as $i$; a terminal voltage across the capacitor 21 is V; the peak value of the current $i_0$ is $i_p$; and the peak value of the voltage $e_0$ is $e_p$ when the circuit of FIG. 4 is in a static state, the following equations are established:

$$V = R_4 i_p - R_5 i - V_f \qquad (1)$$

$$V = V_f + R_6 i - e_p \qquad (2)$$

If the term $i$ is cancelled from the equations (1) and (2), the following equation (3) is derived:

$$V = \frac{1}{R_5 + R_6}[R_4 R_6 i_p - R_5 e_p + (R_5 - R_6)V_f] \qquad (3)$$

When the voltage V becomes larger than the voltage drop across the base-emitter of the transistor 20, the transistor 20 becomes conductive to protect the output transistor 11.

If $V = V_{BE} = V_f$, the following equation (4) is obtained from the equation (3):

$$i_p = \frac{R_5 e_p}{R_4 R_6} + \frac{2V_f}{R_4} \qquad (4)$$

In this case $$\frac{e_p}{i_p} = Z$$

is assumed. In other words, the voltages $i_0R_4$ and $e_0$ are rectified peak values by the diodes 18 and 19, respectively, and then converted to a DC voltage V through the capacitor 21, so that the terminal voltage V of the capacitor 21 is independent of the phase shifts of the current $i_0$ and the voltage $e_0$ but depends upon the peak values $i_p$ and $e_p$. Accordingly, $$Z = \frac{e_p}{i_p}$$

shows not only the pure resistance of the load 10 but also its impedance component.

If $$Z = \frac{e_p}{i_p}$$

is placed in equation (4), the following equation (5) can be obtained:

$$i_p = \frac{2V_f R_6}{R_4 R_6 - R_5 Z} \qquad (5)$$

If the value of the load impedance $Z\infty$ is calculated from the equation (5) when $i_p = \infty$(infinity) is satisfied, the following equation (6) is derived:

$$Z\infty = \frac{R_4 R_6}{R_5} \qquad (6)$$

Accordingly, if the load impedance Z is greater than that obtained from the equation (6), the current $i_p$ becomes negative with the result that the transistor 20 will not conduct. However, in the case where the load impedance Z is smaller than $Z\infty$, when the peak current is greater than $i_p$ as shown by the equation (5), the transistor 20 will conduct and protect the transistor 11.

Figure 5:
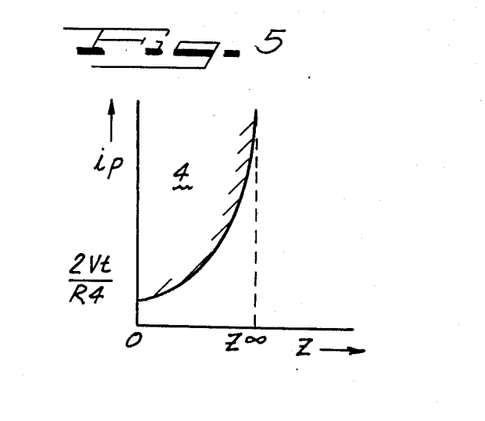
FIGS. 5 to 8, inclusive, are respectively graphs used for explaining the operation characteristics of the protective circuit of the invention.

If a plot is made based upon the equation (5), the graph shown in FIG. 5 is obtained. A region or area 4 in FIG. 5 shows a protective or restricted region in which the transistor 20 becomes conductive to protect the transistor 11. As apparent from the graph of FIG. 5, when Z = 0 or the load is short-circuited, the peak current $i_p$ becomes $$\frac{2V_f}{R_4}$$

which is the minimum value. Accordingly, if the transistor 11 is designed such that the value of its heat generation does not exceed its tolerance value at the current value of $$\frac{2V_f}{R_4},$$

the transistor 11 is protected for continuous short-circuiting of the load.

Figure 6:
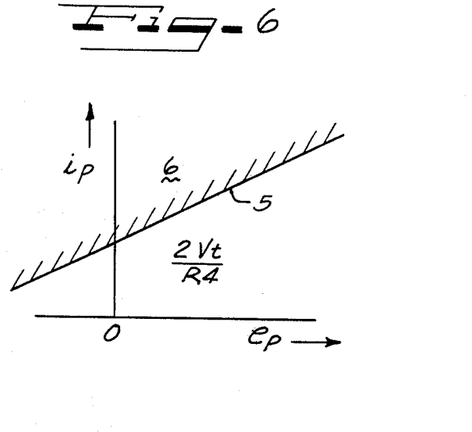

FIG. 6 shows a graph which is obtained by plotting the equation (4). In this case, if the voltage drop across the resistor 14 is neglected, the sum of the collector-emitter voltage $V_{CE}$ of the transistor 11 and the load voltage $e_0$ is Vcc of the voltage source and the load current $i_0$ is equal to the collector current of the transistor 11. Accordingly, if the equation (4) is shown on the characteristic graph between the $V_{CE}$ and $I_C$ of the transistor 11, the graph shown in FIG. 7 is obtained.

Figure 7:
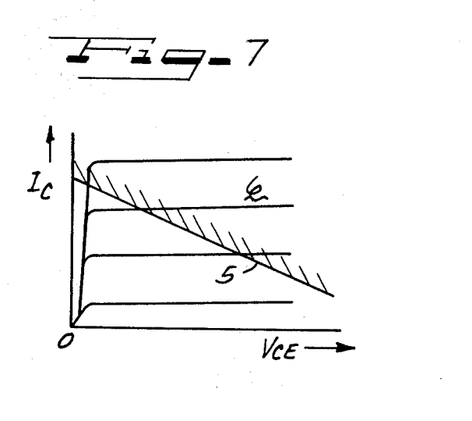
Figure 8:
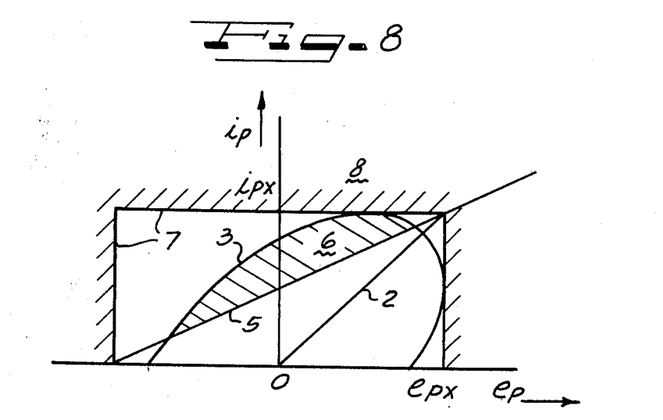

If the load 10 is a pure resistance element, lines 5 in FIGS. 6 to 8 show a protective or restricted line and regions or areas 6 show a protective or restricted regions, respectively. If the load 10 is an impedance element, a broken line 7 in FIG. 8 shows an apparent protective or restricted line and a region 8 in FIG. 8 is a protective or restricted region. Since the terminal voltage V of the capacitor 21 relates to the peak current $i_p$ and the peak voltage $e_p$ as mentioned above, if a load line ($e_p$ versus $i_p$ characteristic) is shown by the line 2 in FIG. 8 in the case where the load is pure resistance with a resistance value equal to the impedance of the load impedance, the values $i_{px}$ and $e_{px}$ of the current $i_p$ and the voltage $i_p$ at the cross point X of the line 2 with the protective or restricted line 5 correspond to a region within which an output can be derived. In the case of an impedance load, even if its load line becomes the ellipse 3 (in FIG. 8 only a positive half cycle is shown) and in intersects the protective or restricted line 5, no protective operation is obtained, but the protective operation is performed only when the ellipse 3 intersects with the broken line 7. Accordingly, even in the case of an impedance load, if the impedance is higher than a tolerance value in correspondence with the broken line 7, an output can be delivered without being used for over protection. In FIG. 8 the positive half cycle only is shown and the protective operation for the positive half cycle is described but it will be apparent that the protective operation is similarly performed for the negative half cycle as for the positive half cycle.

Figure 9:
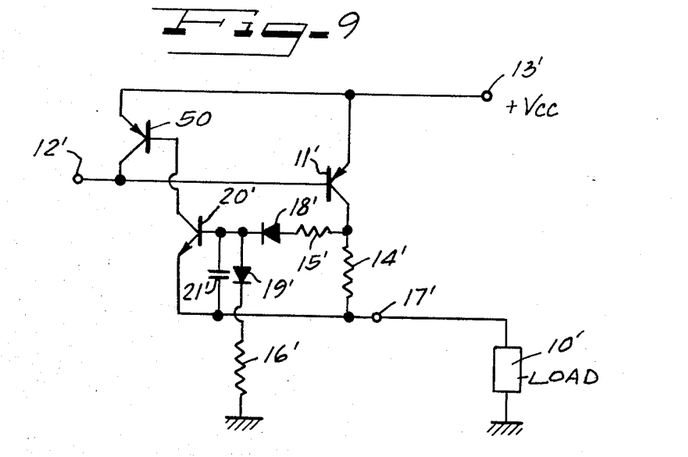
FIG. 9 is an electrical schematic of a modification of the circuit of FIG. 2.

FIG. 9 illustrates a modification of FIG. 2 wherein an additional switching transistor 50 is added to the circuit of FIG. 2 and the connections of the collector of transistor 20 in FIG. 2 is modified. In FIG. 9 all of the components similar to those illustrated in FIG. 2 are designated by the same numerals with a prime added. The transistor 50 has its base electrode connected to the collector electrode of the switching transistor 20'. The emitter electrode of transistor 50 is connected to positive power source terminal 13' and the collector electrode of transistor 50 is connected to terminal 12'.

The transistor 50 will turn on when the voltage across the capacitor 21' reaches a predetermined value as for example, 0.6 volts in a specific embodiment and when transistor 50 conducts it turns off transistor 11'. In this circuit, an input signal which is supplied to the terminal 12' will not leap through the base-collector junction of the transistor 50 and a diode is not necessary between the collector of transistor 20' and terminal 12'. The operation of the circuit in FIG. 9 for load impedance detection is the same as that of FIG. 2 and thus such operation will not be repeated.

Figure 10:
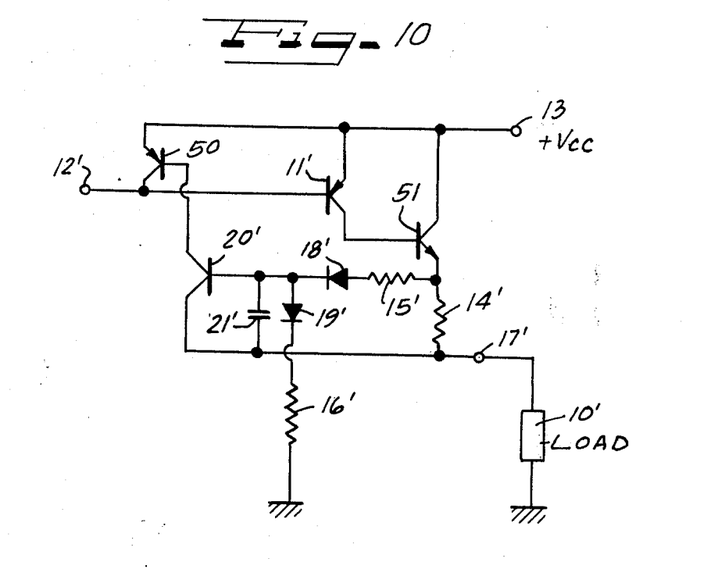
FIG. 10 is an electrical schematic of a modified circuit.

FIG. 10 illustrates a further modification of the circuit of FIG. 9 wherein an additional transistor 51 is connected in a complimentary Darlington configuration with transistor 11'. The collector of transistor 11' is connected to the base of transistor 51 which has its emitter connected to the junction point between resistors 14' and 15' and its collector connected to positive voltage terminal 13'. The circuit of FIG. 10 operates the same as the circuit of FIG. 9.

Figure 11:
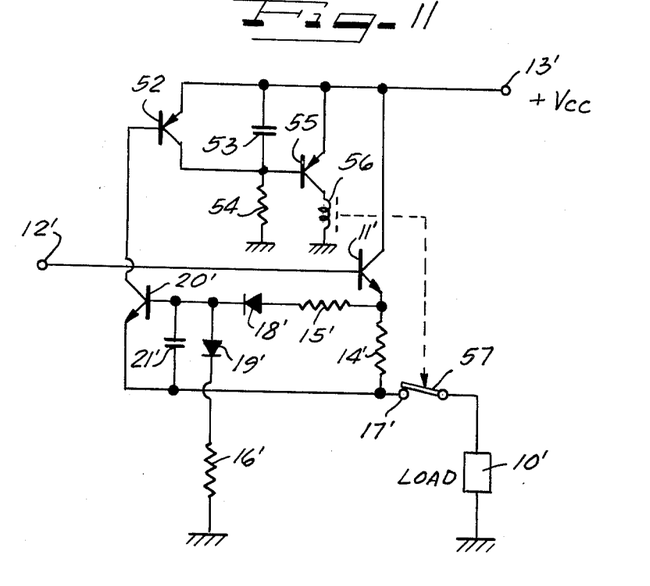
FIG. 11 is an electrical schematic of a relay type protective circuit.

FIG. 11 illustrates a relay type protective circuit. Components which are similar to those in FIG. 2 are designated with the same numerals with a prime. The collector of transistor 20' is connected to the base of transistor 52 which has its emitter connected to the positive voltage supply terminal 13'. The collector of transistor 52 is connected to ground through a resistor 54 and to the base of a transistor 55 which has its emitter connected to the positive voltage terminal 13'. A capacitor 53 is connected between the emitter and base of transistor 55 as shown. A relay coil 56 is connected between ground and the collector of the transistor 55 and the relay 56 controls a switch 57 for controlling the connection of the load 10' to the terminal 17'.

In operation, when transistor 11' operates in the safe power consumption area, the transistor 20' and 52 will be in the off state and transistor 55 will be in the on state. Thus, since transistor 55 is in the on state, relay coil 56 will be energized and switch 57 will be closed connecting the load 10' to the terminal 17'.

When the transistor 11' is in the overloaded state, the voltage across capacitor 21' will become higher than a predetermined value as for example, 0.6 volts in a particular embodiment which turns transistors 20' and 52 ON.

Stored charges in the capacitor 53 are discharged through the emitter-collector path of the transistor 52 which will turn the transistor 55 off causing the relay coil 56 to be de-energized thus opening switch 57 to turn off transistor 11'. In this circuit after the protective operation has been performed the switch 57 will remain open for a predetermined time determined by the time constant of the capacitor 53 and the resistor 54.

Figure 12:
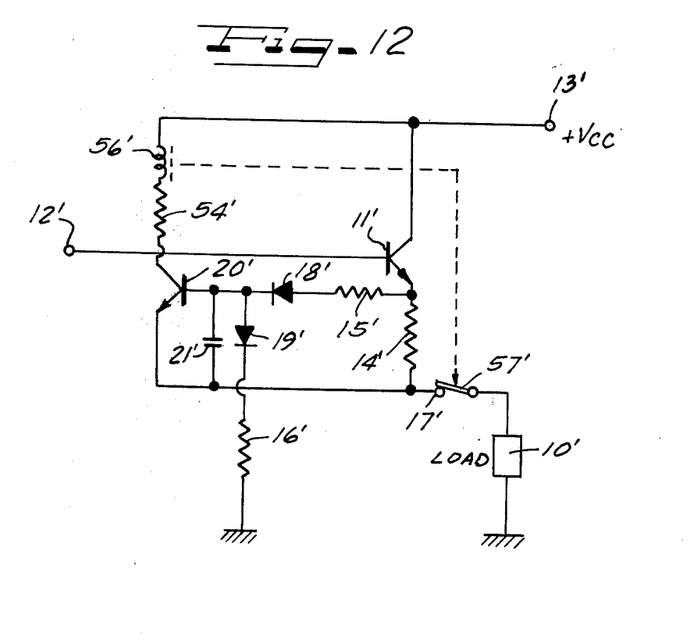
FIG. 12 is an electrical schematic of a modified relay type protective circuit.

FIG. 12 is a modified relay type circuit wherein the collector of transistor 20' is connected to a resistor 54' which has its other side connected to the energizing coil 56' of a relay which moves switch 57'. The other side of coil 56' is connected to terminal 13'. The circuit of FIG. 12 operates such that transistor 20' turns ON when an overload condition exists and when transistor 20' turns ON current flows through the relay coil 56' which opens switch 57' and thus disconnects the load 10'. This also opens the connection of the emitter of transistor 11' and cuts it off. The transistor 11' remains in the cut-off position until the relay coil 56' is de-energized which closes switch 57'.

Figure 13:
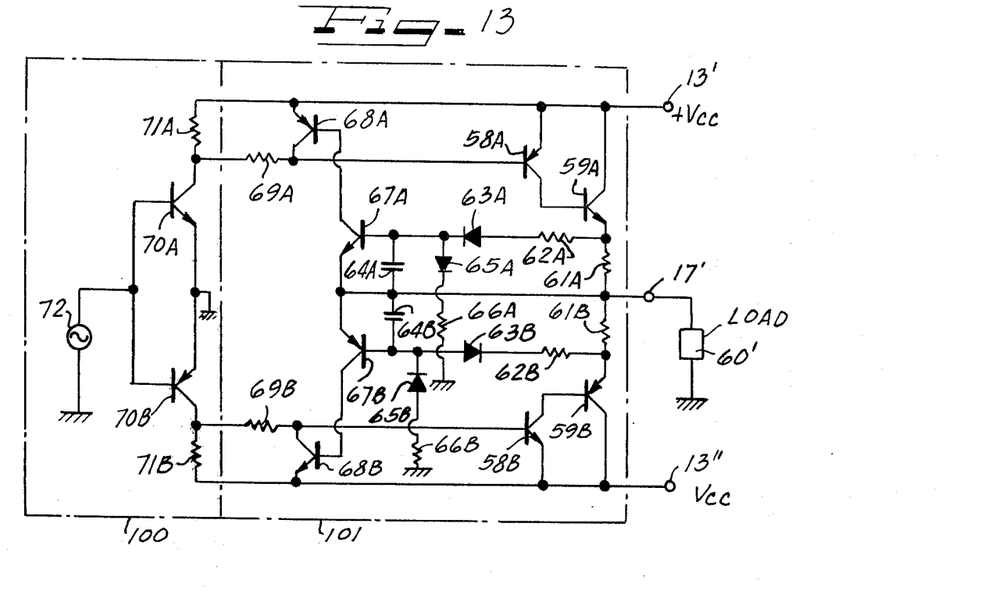
FIG. 13 is an electrical schematic of a single ended push-pull amplifier protective circuit.

FIG. 13 comprises a modified circuit of the circuit of FIG. 10 and includes an input signal source 72 with one side grounded and its other side connected to the bases of transistors 70A and 70B. The emitters of these transistors are connected together and to ground. The collector of transistor 70A is connected to resistor 71A which has its other side connected to positive bias source at terminal 13'. The transistor 70B has its collector connected through a resistor 71B to a negative bias source at terminal 13''. A transistor 68A has its emitter connected to terminal 13' and its collector connected through a resistor 69A to the collector of transistor 70A. The base of transistor 68A is connected to the collector of a transistor 67A which has its emitter connected to the emitter of a transistor 67B. The collector of transistor 67B is connected to the base of a transistor 68B which has its emitter connected to the negative bias terminal 13''. A resistor 69B is connected from the collector of transistor 70B to the collector of transistor 68B. A transistor 58A has its base connected to the collector of transistor 68A and its emitter connected to bias terminal 13'. The collector of transistor 58A is connected to the base of transistor 59A. The collector of transistor 59A is connected to terminal 13'. The emitter of transistor 59A is connected through a resistor 61A to a load terminal 17' to which a load 60' is connected with its other side grounded. A resistor 61B is connected from terminal 17' to the emitter of transistor 59B which has its collector connected to terminal 13''. A transistor 58B has its base connected to the collector of 68B and its emitter connected to terminal 13'' and its collector connected to the base of transistor 59B. A condensor 64A is connected between the base of transistor 67A and terminal 17'. A condensor 64B is connected from the base of transistor 57B to terminal 17'. A diode 65B has its cathode connected to the base of transistor 67B and its anode connected to a resistor 66B which has its other side connected to ground. A diode 65A has its anode connected to the base of transistor 67A and its cathode connected to a resistor 66A which has its other side connected to ground. A diode 63A has its cathode connected to the base of transistor 67A and its anode connected to a resistor 62A which has its other side connected to the emitter of transistor 59A. A diode 63B has its anode connected to the base of transistor 67B and its cathode connected to a resistor 62B which has its other side connected to the emitter of transistor 59B.

It is to be noted that transistors 58A and 59A are connected in Darlington fashion as are transistors 58B and 59B. This circuit operates similar to the circuit of FIG. 9 wherein the transistor 68A turns ON when the voltage across the capacitor 64A exceeds a predetermined value and cuts off transistors 58A and 59A. The circuit is a push-pull arrangement and the lower portion of this circuit operates in a similar fashion to the upper portion and provides protection for the components.

Figure 14:
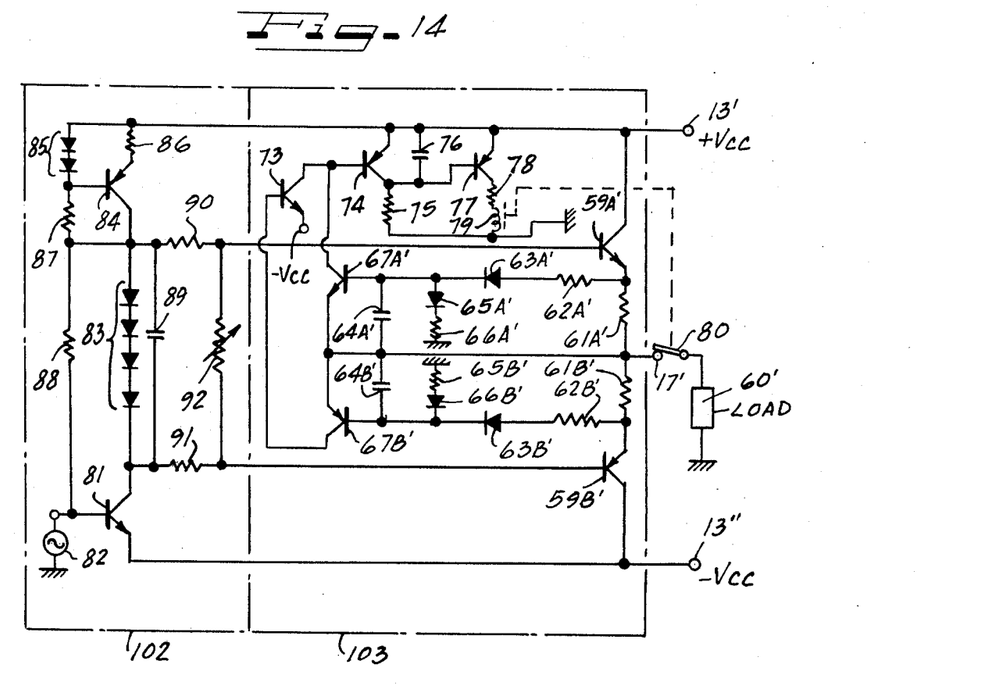
FIG. 14 is an electrical schematic of a modified circuit.

FIG. 14 circuit is a modification which is similar to the circuit of FIG. 13. A signal source 82 has its one side connected to ground and other side connected to the base of a transistor 81 which has its emitter connected to the negative bias terminal 13''. The base of transistor 81 is also connected through a resistor 88 and a resistor 87 to serially connected diodes 85 which have their other sides connected to positive bias terminal 13'. A resistor 86 has one side connected to terminal 13' and its other side connected to the emitter of transistor 84 and its collector connected to the junction point between resistors 87 and 88 and to four diodes 83 connected in series and with their other terminal connected to the collector of transistor 81. A transistor 74 has its emitter connected to terminal 13' and its base connected to the collector of transistor 73 which has its emitter connected to a suitable bias source minus Vcc. The base of transistor 73 is connected to the collector of transistor 67B' which has its emitter connected to terminal 17' and to the emitter of a transistor 67A' which has its collector connected to the base of transistor 74. A transistor 59A' has its collector connected to terminal 13' and its base connected to a resistor 90 which has its other side connected to the junction point of resistors 87 and 88. A capacitor 89 is connected from resistor 90 to a resistor 91 which has its other side connected to the base of a transistor 59B'. The collector of transistor 59B' is connected to terminal 13'' and its emitter is connected to a resistor 61B' which has its other side connected to terminal 17'. A resistor 62A' is connected from the emitter of transistor 59A' to the anode of diode 63A' which has its cathode connected to the base of transistor 67A'. A diode 65A' is connected from the base of transistor 67A' to a resistor 66A' which has its other side grounded. Capacitor 64A' is connected from the base of transistor 67A' to terminal 17'. A capacitor 64B' is connected from the base of transistor 67B' to the terminal 17'. A diode 66B is connected from the base of transistor 67B' to a resistor 65B' which has its other side connected to ground. Diode 63B' is connected from the base of transistor 67B' to a resistor 62B' which has its other side connected to the emitter of transistor 59B'.

A transistor 77 has its emitter connected to terminal 13' and its base connected to the collector of transistor 74. A resistor 78 is connected to the collector of transistor 77 and a relay energizing coil 79 is connected from the resistor 78 to ground. A resistor 75 and capacitor 76 are connected from ground to terminal 13' and the collector of transistor 74 is connected to their junction points.

The relay coil 79 controls a switch 80 which controls the switch 80 connected to the load 60'. In operation the circuit of FIG. 14 operates in the following manner. Transistor 74 turns ON when the capacitor 64A' or 64B' have a voltage which exceeds a predetermined value so as to open the relay switch 80 by relay coil 79. The diode 83, the resistors 90 and 91 and the variable resistor 92 provide for applying a fixed DC bias voltage to the base electrodes of the push-pull connected transistors 59A' and 59B'. The transistor 84 is used as a constant current source and operates as a load connected to the collector electrode of the transistor 81.

It is seen that the present invention provides a number of embodiments for protecting a transistor amplifier and although the invention has been described with respect to preferred embodiments it is not to be so limited as changes and modifications may be made therein which are within the full intended scope as defined by the appended claims.

I claim as my invention:

1. A protective circuit for a transistor amplifier comprising:
   a. a DC voltage source;
   b. a first transistor having first, second and third electrodes, said first electrode supplied with an input signal to be amplified and said second electrode connected to said voltage source;
   c. a first resistor with one side connected to said third electrode;
   d. a load connected between the other side of said first resistor and a reference point;
   e. a first capacitor;
   f. first circuit means including a first diode and a second resistor connected in series between one side of said first capacitor and said one side of said first resistor to supply a first DC voltage of one polarity proportional to a voltage across said first resistor to said first capacitor;
   g. second circuit means including a second diode and a third resistor connected in series between said one side of said first capacitor and said reference point to supply a second DC voltage of the other polarity proportional to a voltage across said load to said first capacitor;
   h. voltage detecting means for detecting the output voltage across said first capacitor and producing a control signal when the voltage becomes a predetermined value;
   i. switching means controlled by said control signal so as to cut off operation of said first transistor, and wherein said voltage detecting means includes a second transistor having first, second and third electrodes, said first and second electrodes being connected across said first capacitor, said third electrode producing said control signal when the voltage across said first capacitor becomes a predetermined value; and said switching means includes at least one further transistor controlled by said control signal, a relay coil connected as the load for said further transistor, a relay switch controlled by said relay coil and connected between said third electrode of said first transistor and said load so as to cut off the operation of said first transistor.

2. A protective circuit according to claim 1 wherein said switching means includes a fifth transistor controlled by said control signal, a relay coil energized by said fifth transistor, a relay switch controlled by said relay coil and connected between said load and said first resistor.

3. A protective circuit according to claim 2 including a plurality of series connected diodes connected to said voltage source and to said first and second transistors to supply a fixed direct current biasing voltage thereto.

4. A protective circuit for a transistor amplifier according to claim 1, wherein said switching means comprise:
 a. a third transistor having first, second and third electrodes, said first electrode being connected to said third electrode of said second transistor, a fourth resistor, said second and third electrodes connected between said voltage source and said reference point through said fourth resistor;
 b. a second capacitor connected between said second and third electrodes of said third transistor;
 c. said further transistor having first, second and third electrodes, said first electrode of said further transistor connected to the connection point of said second capacitor and said fourth resistor, and said second and third electrodes of said further transistor connected between said voltage source and through said relay coil to said reference point and said relay coil closing said relay switch when said fourth transistor is in the ON state.

5. A protective circuit for a transistor amplifier comprising:
 a. a DC voltage source;
 b. a first transistor having first, second and third electrodes, said first electrode supplied with an input signal to be amplified and said second electrode connected to said voltage source;
 c. a first resistor with one side connected to said third electrode;
 d. a load connected between the other side of said first resistor and a reference point;
 e. a first capacitor;
 f. first circuit means including a first diode and a second resistor connected in series between one side of said first capacitor and said one side of said first resistor to supply a first DC voltage of one polarity proportional to a voltage across said first resistor to said first capacitor;
 g. second circuit means including a second diode and a third resistor connected in series between said one side of said first capacitor and said reference point to supply a second DC voltage of the other polarity proportional to a voltage across said load to said first capacitor;
 h. voltage detecting means for detecting the output voltage across said first capacitor and producing a control signal when the voltage becomes a predetermined value;
 i. switching means controlled by said control signal so as to cut off operation of said first transistor, and wherein said voltage detecting means includes a second transistor having first, second and third electrodes, said first and second electrodes connected across said first capacitor, said third electrode producing said control signal when the voltage across said first capacitor becomes a predetermined value, and said switching means comprises a relay coil connected between said voltage source and said third electrode of said second transistor, and a relay switch controlled by said relay coil and connected between said load and said first resistor to cut off said first transistor from said load during overload condition.

6. A protective circuit according to claim 4 further including a fourth transistor having first, second and third electrodes, said first electrode supplied with said input signal, a second voltage source connected to the second electrode of said fourth transistor, a fifth resistor with one side connected to said third electrode of said fourth transistor and its other side connected to said relay switch, third circuit means including third diode, a third capacitor, a sixth resistor connected in series between one side of said third capacitor and said one side of said fifth resistor to supply a third DC voltage proportional to a voltage across said fifth resistor to said third capacitor, fourth circuit means including a fourth diode and a seventh resistor connected in series between said one side of said third capacitor and said reference point to supply a fourth DC voltage proportional to a voltage across said load to said third capacitor, second voltage detecting means connected across said third capacitor and connected to said switching means to cut off operation of said first transistor.

7. A protective circuit for a transistor amplifier comprising:
 a. a DC voltage source;
 b. a first transistor having first, second and third electrodes, said first electrode supplied with an input signal to be amplified and said second electrode connected to said voltage source;
 c. a first resistor with one side connected to said third electrode;
 d. a load connected between the other side of said first resistor and a reference point;
 e. a first capacitor;
 f. first circuit means including a first diode and a second resistor connected in series between one side of said first capacitor and said one side of said first resistor to supply a first DC voltage of one polarity proportional to a voltage across said first resistor to said first capacitor;
 g. second circuit means including a second diode and a third resistor connected in series between said one side of said first capacitor and said reference point to supply a second DC voltage of the other polarity proportional to a voltage across said load to said first capacitor;
 h. a second transistor having first, second and third electrodes, said first electrode supplied with an input signal to be amplified and said second electrode connected to receive a bias of opposite polarity to that supplied to said second electrode of said first transistor;
 i. a fourth resistor with one side connected to said third electrode of said second transistor and its other side connected to said load;
 j. a second capacitor;
 k. third circuit means including a third diode and a fifth resistor connected in series between one side of said second capacitor and said load;
 l. fourth circuit means including a fourth diode and sixth resistor between said one side of said second capacitor and said reference point;
 m. voltage detecting means for detecting the output voltage across said first and second capacitors and producing a control signal when the voltage has predetermined values, switching relay means controlled by said control signal so as to cut off operation of said first and second transistors and wherein said voltage detecting means includes a third transistor having at least input and output electrodes, said input electrode connected to receive the voltage across said first capacitor and said output electrode producing said control signal when said output voltage becomes a predetermined value, a fourth transistor having at least input and output electrodes, said input electrode connected to receive the voltage across said second capacitor and said output electrode producing said control signal when said output voltage becomes a predetermined value.

* * * * *